(12) United States Patent
Park

(10) Patent No.: US 9,825,604 B2
(45) Date of Patent: Nov. 21, 2017

(54) LINE FILTER AND ELECTRIC POWER SUPPLY DEVICE COMPRISING SAME

(71) Applicant: LG INNOTEK CO., LTD., Seoul (KR)

(72) Inventor: Jong Jun Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 128 days.

(21) Appl. No.: 14/436,989

(22) PCT Filed: Oct. 16, 2013

(86) PCT No.: PCT/KR2013/009266
§ 371 (c)(1),
(2) Date: Apr. 20, 2015

(87) PCT Pub. No.: WO2014/062005
PCT Pub. Date: Apr. 24, 2014

(65) Prior Publication Data
US 2015/0288340 A1 Oct. 8, 2015

(30) Foreign Application Priority Data

Oct. 18, 2012 (KR) .................. 10-2012-0115933

(51) Int. Cl.
*H01F 5/00* (2006.01)
*H03H 1/00* (2006.01)
(Continued)

(52) U.S. Cl.
CPC ............. *H03H 1/00* (2013.01); *H01F 5/00* (2013.01); *H01F 17/04* (2013.01); *H01F 27/28* (2013.01);
(Continued)

(58) Field of Classification Search
CPC .................. H01F 5/00; H01F 27/00–27/30
(Continued)

(56) References Cited

U.S. PATENT DOCUMENTS 4,342,013 A * 7/1982 Kallman ........... H02H 9/005
177/185
4,761,623 A * 8/1988 Schneider ........ H03H 1/0007
333/12

(Continued)

FOREIGN PATENT DOCUMENTS

JP 2000-114025 A 4/2000
JP 2008-227019 A 9/2008
(Continued)

OTHER PUBLICATIONS

International Search Report dated Dec. 17, 2013 issued in Application No. PCT/KR2013/009266.

*Primary Examiner* — Tuyen Nguyen
(74) *Attorney, Agent, or Firm* — KED & Associates, LLP

(57) ABSTRACT

Disclosed are a line filter and a power supply apparatus including the line filter. The line filter includes a first inductor having a first coil wound around a first bobbin; and a second inductor having a second coil wound around a second bobbin, the second inductor being induced by the first inductor to flow current, wherein the first bobbin and the second bobbin are physically separated from each other. The power supply apparatus includes such a line filter.

3 Claims, 2 Drawing Sheets

(51) Int. Cl.
    *H01F 27/28*     (2006.01)
    *H01F 17/04*     (2006.01)
    *H03H 7/42*     (2006.01)
    *H02M 1/12*     (2006.01)
    *H02M 7/06*     (2006.01)
    *H01F 17/00*     (2006.01)
    *H02M 1/44*     (2007.01)

(52) U.S. Cl.
    CPC ............... *H02M 1/12* (2013.01); *H02M 7/06* (2013.01); *H03H 7/427* (2013.01); *H01F 2017/0093* (2013.01); *H02M 1/126* (2013.01); *H02M 1/44* (2013.01); *H02M 2001/123* (2013.01); *H03H 1/0007* (2013.01); *H03H 2001/0035* (2013.01); *H03H 2001/0092* (2013.01)

(58) Field of Classification Search
    USPC ............ 336/65, 83, 192, 196, 198, 200, 232
    See application file for complete search history.

(56) References Cited

U.S. PATENT DOCUMENTS

| | | | | |
|---|---|---|---|---|
| 4,888,675 A * | 12/1989 | Kumar | ................ | H02M 1/14 333/181 |
| 5,023,585 A * | 6/1991 | Kurano | ................ | H01F 27/263 333/177 |
| 5,155,457 A * | 10/1992 | Oda | .................... | H03H 1/0007 333/167 |
| 5,227,745 A * | 7/1993 | Oda | .................... | H01F 27/263 333/167 |
| 5,920,466 A * | 7/1999 | Hirahara | ........... | H02M 3/33523 348/E5.127 |
| 6,735,097 B1 * | 5/2004 | Prasad | ................ | H02M 1/4225 363/44 |
| 8,049,590 B2 * | 11/2011 | Huh | ........................ | H01F 38/10 336/192 |
| 2002/0071290 A1* | 6/2002 | Youn | .................... | H01R 31/065 363/15 |
| 2003/0095419 A1* | 5/2003 | Yasumura | ........... | H02M 1/4208 363/21.02 |
| 2009/0225528 A1* | 9/2009 | Bergman | ............. | H04B 15/005 361/814 |
| 2009/0289557 A1* | 11/2009 | Itoh | .................... | H05B 41/2882 315/127 |
| 2012/0154363 A1* | 6/2012 | Kim | ...................... | H01F 27/306 345/211 |
| 2013/0154782 A1* | 6/2013 | Won | .......................... | H01F 5/02 336/192 |

FOREIGN PATENT DOCUMENTS

| KR | 10-2010-0054299 A | 5/2010 |
|---|---|---|
| KR | 10-1153580 B1 | 6/2012 |

\* cited by examiner (a)

(b)

(c)

LINE FILTER AND ELECTRIC POWER SUPPLY DEVICE COMPRISING SAME

CROSS-REFERENCE TO RELATED PATENT APPLICATIONS

This application is a U.S. National Stage Application under 35 U.S.C. §371 of PCT Application No. PCT/KR2013/009266, filed Oct. 16, 2013, which claims priority to Korean Patent Application No. 10-2012-0115933, filed Oct. 18, 2012, whose entire disclosures are incorporated herein by reference.

TECHNICAL FIELD

The embodiment relates to a line filter and a power supply apparatus including the line filter.

BACKGROUND ART

In general, an AC power supply to supply AC power to a device is realized by using a switching mode power supply (SMPS). Noise caused by the switching operation of the SMPS is conducted through an external case provided adjacent to the SMPS, so that the nose is induced into a capacitor included in a noise filter of a power source. In addition, the noise induced into the capacitor of the noise filter is transferred to an input terminal of an AC power source to exert an influence on the operation of other electronic products, which is called electromagnetic interference (EMI). Accordingly, in order to remove the EMI, a line filter is required.

A normal line filter attenuates the noise introduced into a power source line to prevent the malfunction of circuits or components connected to a next terminal or a device connected to an output terminal and reduces conductive noise or radiative noise generated in a switching power source to prevent the EMI from occurring in other external devices.

As typical line filters, there are a line filter employing an EE core or an EI core and a troidal core line filter employing a circular core.

FIG. 1 is a view showing a line filter according to the related art.

FIG. 1 (*a*) shows a line filter employing an EE core. The line filter employing the EE core has a shape, which may cause leakage inductance at a core bonding section as great current is input thereto and may reduce an inductance value of the whole line filter. Thus, more winding coils are required to maintain the target inductance of the line filter, so the economic efficiency may be degraded.

Meanwhile, FIGS. 1 (*a*) and (*c*) show a troidal core line filter employing a circular core. The troidal core line filter may be stably operated, but it is impossible to automatically wind coils around a circular bobbin. Thus, the coil wining work may be manually performed, so that the productivity and the economic efficiency may be degraded.

DISCLOSURE

Technical Problem

The embodiment provides a line filter capable of improving the electric efficiency and economic efficiency by suppressing the leakage current and capable of enhancing the productivity and the economic efficiency by automatically winding coils.

The embodiment provides a line filter capable of improving the efficiency of the line filter by employing a novel polishing scheme.

The embodiment also provides an improved power supply apparatus including the line filter line filter.

Technical Solution

A line filter according to the embodiment includes a first inductor having a first coil wound around a first bobbin; and a second inductor having a second coil wound around a second bobbin, the second inductor being induced by the first inductor to flow current, wherein the first bobbin and the second bobbin are physically separated from each other.

A power supply apparatus according to the embodiment includes a filter unit having a line filter to filter an input AC signal; a rectifying unit to rectify the filtered signal into a DC signal; and a transforming unit to convert the DC signal to have a predetermined size, wherein the line filter includes a first inductor having a first coil wound around a first bobbin; and a second inductor having a second coil wound around a second bobbin, the second inductor being induced by the first inductor to flow current, and wherein the first bobbin and the second bobbin are physically separated from each other.

Advantageous Effects

According to the embodiment, heat generated from a bonding point between inductance of the line filter and a core can be reduced by reducing leakage inductance using a core having a novel shape.

In addition, coils can be automatically wound around a bobbin by using a core having a novel shape, so the productivity and the economic efficiency of the core can be improved.

Further, an error of a core can be reduced by employing a novel polishing scheme so that the reliability of the line filter can be improved.

In addition, the leakage inductance can be reduced by using a cover that covers a core part, so that the inductor efficiency and the EMI removal property can be improved.

BEST MODE

Mode for Invention

Figure 1:
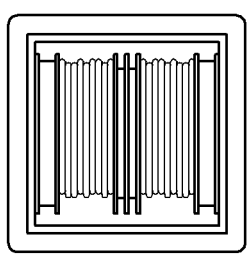
FIG. 1 is a view showing a line filter according to the related art.
Figure 1:
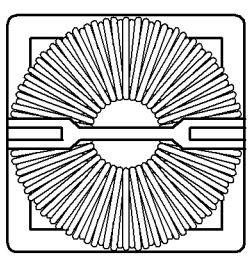
Figure 1:
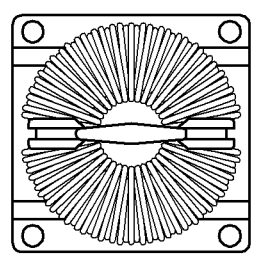

Hereinafter, embodiments will be described in detail with reference to accompanying drawings so that those skilled in the art can easily work with the embodiments. However, the embodiments may not be limited to those described below, but have various modifications. In addition, only components related to the embodiment are shown in drawings for the clarity of explanation and the similar reference numerals will be assigned to the similar elements throughout the specification.

In the following description, when a predetermined part "includes" a predetermined component, the predetermined part does not exclude other components, but may further include other components unless otherwise indicated.

The thickness of each layer and region shown in the drawings may be exaggerated for the purpose of convenience or clarity. In addition, the same reference numerals are assigned to the similar elements throughout the specification. It will be understood that, when a layer, a film, a region or a plate is referred to as being "on" or "under" another layer, film, region or plate, it can be "directly" over the other layer, film, region or plate or one or more intervening layers may also be present. In contrast, when a part is referred as being "directly on" the other part, there is no intervening layer.

Hereinafter, a line filter and a power supply apparatus including the line filter according to the embodiment will be described with reference to FIGS. 2 to 4.

Figure 2:
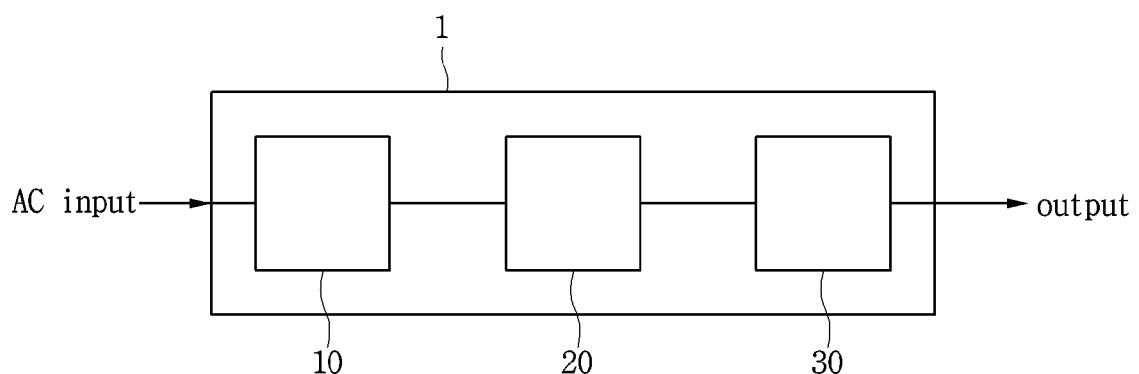
FIG. 2 is a block view showing a power supply apparatus according to one embodiment.
Figure 3:
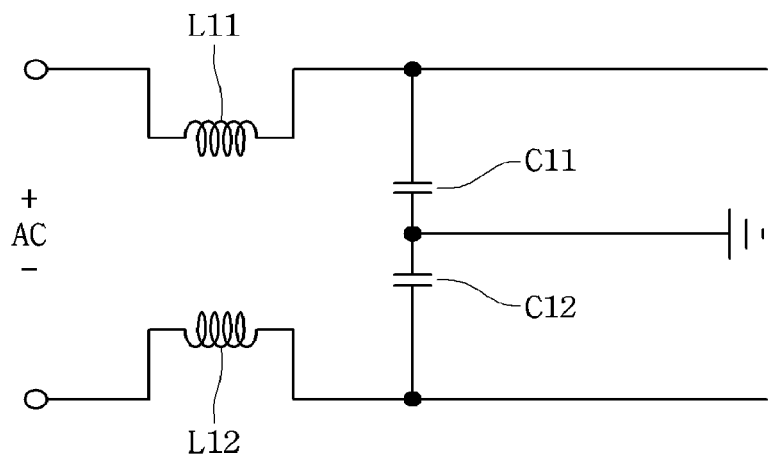
FIG. 3 is a circuit view of a filter unit according to one first embodiment.
Figure 4:
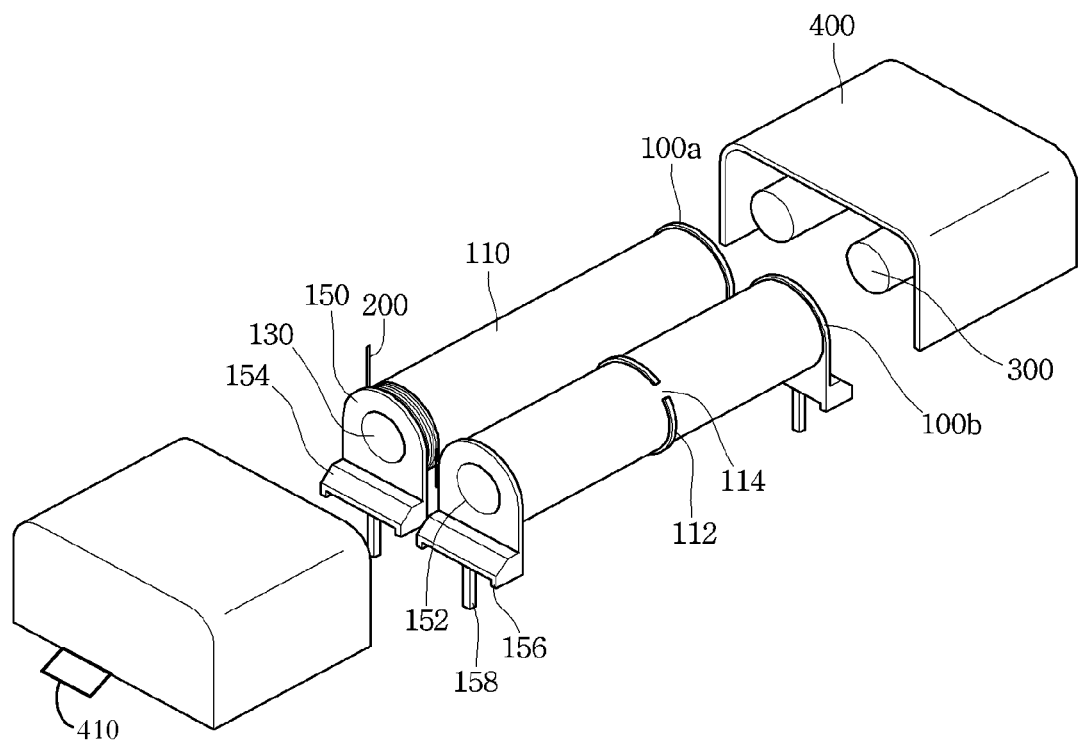
FIG. 4 is an exploded perspective view of a line filter according to one embodiment.

FIG. 2 is a block view showing the power supply apparatus according to one embodiment, FIG. 3 is a circuit view of a filter part according to one first embodiment and FIG. 4 is an exploded perspective view of the line filter according to one embodiment.

Referring to FIG. 2, the power supply apparatus 1 includes a filter unit 10, a rectifying unit 20 and a transforming unit 30.

The filter unit 10 removes electromagnetic interference (EMI) penetrated along with input AC signals. The input AC signals may include the EMI which may cause the malfunction of electronic appliances, so it is necessary to remove the EMI.

Thus, the filter unit 10 removes the EMI penetrated along with the input AC signals in order to output AC signals having no EMI to the rectifying unit 20.

Upon receiving the AC signals having no EMI from the filter unit 10, the rectifying unit converts the AC signals into DC signals to output the DC signals to the transforming unit 30.

As the DC signals are input from the rectifying unit 20, the transforming unit 30 converts the DC signals to have a predetermined size and outputs the DC signals.

Hereinafter, elements and functions of the filter unit 10 according to one embodiment will be described with reference to FIG. 3. The filter unit 10 includes a line filter having a first coil L11 and a second coil L12, a first capacitor C11 and a second capacitor C12, in which the coils and the capacitors constitute an LC loop.

The line filter receives AC power through one end of the first coil L11 and the second coil L12. The EMI included in the AC power may be removed through the LC loop, so that the AC power having no EMI can be output.

The filter unit may have at least two line filters shown in FIG. 3, and first and second capacitors may be provided between both ends of the line filters and the ground, respectively.

The first and second capacitors are Y capacitors for removing common mode noise.

Hereinafter, the line filter according to the embodiment will be described with reference to FIG. 4.

Referring to FIG. 4, the line filter includes a bobbin 100 (100a and 100b), a coil 200, a magnetic core 300 and a cover part 400.

The coil is wound around the bobbin 100 and the magnetic core is accommodated in the bobbin 100. The line filter 10 includes a first bobbin 100a and a second bobbin 100b. Although the first bobbin 100a is physically separated from the second bobbin 100b, the first and second bobbins 100a and 100b have the same structure and functions.

The bobbin 100 includes a body 110, a through hole 130 and a coupling member 150.

The coil 200 is wound around an outer surface of the body 110 having a cylindrical shape or a polygonal column shape. Thus, the coil 200 is wound around the lateral side of the column.

The body 110 may further include a partition plate 112 and a connection hole 114. The partition plate 112 is used for partitioning the coils 200 wound around the body 110 and a plurality of partition plates 112 may be provided.

The connection hole 114 is formed in the partition plate 112 in order to allow the coil 200, which is wound around the body 110 and partitioned by the partition plate 112, to be connected with each other while fixing the position of the coil 200.

The through hole 130 is formed through upper and lower surfaces of the body 110 in the axial direction of the body 110. The through hole 130 may receive the magnetic core 300 therein.

The coupling member 150 includes a hole 152, a first protrusion 154, a second protrusion 156 and a connection part 158. The coupling member 150 is provided at the upper and lower surfaces of the body 110.

The hole 152 corresponds to the through hole 130 of the body 110 and may receive the magnetic core 300 therein.

The coupling member 150, which is parallel to the upper surface or the lower surface of the body 110, has a size larger than a size of the upper surface or the lower surface of the body 110 to prevent the coil 200 wound around the body 110 from being separated from the body 110.

The first protrusion 154 protrudes in the direction perpendicular to a plane where the hole 152 is formed. The first protrusion 154 may support the cover part 400 when the cover part 400 is coupled with the bobbin 100.

The second protrusion 156 protrudes toward a plane where the coupling member 150 makes contact with a substrate. The second protrusion 156 may reinforce the coupling force between the bobbin 100 and the substrate.

The connection part 158 is formed in the plane where the coupling member 150 makes contact with the substrate. The connection part 158 may input signals from a printed circuit board to the coil 200 wound around the bobbin 100 or output the signals, which have been filtered through the line filter, to the printed circuit board.

Meanwhile, the first and second bobbins 100a and 100b are configured to be physically separated from each other. In this case, when compared with the line filter according to the related art where the first and second cores are formed in one bobbin, the leakage inductance can be reduced and the coil can be automatically wound.

In addition, the bobbin 100 can be formed through a polishing scheme. That is, the inductance of the core can be adjusted by forming the bobbin 100 through the polishing scheme. If the typical grinding scheme is employed, the surface roughness of the bobbin 100 may become irregular, so the error may occur in the inductance of the core. According to the embodiment, the bobbin 100 is formed through the polishing scheme, so that the surface roughness of the bobbin 100 can be regular and the error in the inductance of the core can be reduced.

The magnetic core 300 is received in the through hole 130 of the bobbin 100 to increase the magnetic flux of the coil.

The magnetic core 300 includes insertion parts received in the through holes 130 of the first core 100a and the second core 100b, and may have a rectangular ring shape for connecting the insertion parts. However, the magnetic core 300 may be configured as two bodies having "⊏" shapes to simplify the manufacturing process and to facilitate the coupling work.

In addition, in order to facilitate the coupling work, the magnetic core 300 may be coupled to the cover part 400.

Further, the magnetic core 300 may include a ferrite coil.

The cover part 400 covers the upper surfaces and lateral sides of the first and second bobbins 100a and 100b in order to prevent interference from electric wires and peripheral components disposed adjacent to the line filter and to reduce the leakage inductance, thereby improving the efficiency of the line filter. In addition, the cover part 400 prevents the bobbin 100 from being fluctuated to protect the line filter from external impact.

Further, the cover part 400 includes a fastening unit 410 to fix the cover part 400 to the printed circuit board. A plurality of fastening units may be provided.

Although embodiments have been described with reference to a number of illustrative embodiments thereof, it should be understood that numerous other modifications and embodiments can be devised by those skilled in the art that will fall within the spirit and scope of the principles of this disclosure.

The invention claimed is:

1. A line filter comprising:
   a first bobbin having a first through hole formed through upper and lower surfaces of a first body in an axial direction;
   a second bobbin having a second through hole formed through upper and lower surfaces of a second body in the axial direction and physically separated from the first bobbin;
   a first inductor having a first coil wound around the first body of the first bobbin;
   a second inductor having a second coil wound around the second body of the second bobbin, the second inductor being induced by the first inductor to flow current;
   first magnetic cores inserted into first sides of the first and second through holes of the first and second bobbins;
   second magnetic cores inserted into second sides of the first and second through holes of the first and second bobbins, the second sides being opposite to the first sides;
   coupling members provided at both the first and second sides of the first and second bobbins; and
   a cover part to cover upper surfaces and lateral sides of the first and second bobbins and the first and second magnetic cores,
   wherein the first inductor is connected to ground via a first path that includes a first capacitor and excludes a second capacitor, and the second inductor is connected to ground via a second path that includes the second capacitor and excludes the first capacitor,
   wherein the first bobbin is parallel to the second bobbin,
   wherein the cover part includes:
      a first cover part coupled to the first magnetic cores and including a first fastening part to fix the first cover part to a printed circuit board; and
      a second cover part coupled to the second magnetic cores and physically separated from the first cover part, and including a second fastening part to fix the second cover part to the printed circuit board,
   wherein the coupling members include:
      a third through hole corresponding to the first through hole of the first body and the second through hole of the second body;
      a first protrusion protruding in the axial direction of the first and second bobbins to support the cover part; and
      a second protrusion provided at lower surfaces of the coupling members and coupled with the printed circuit board,
   wherein the first protrusion is protruded in a direction perpendicular to a plane where the third through hole is formed,
   wherein the second protrusion is protruded toward a plane where the coupling member makes contact with the printed circuit board, and
   wherein surfaces of the first bobbin and the second bobbin are formed through a polishing scheme.

2. The line filter of claim 1, wherein at least one of the first bobbin or the second bobbin comprises:
   a partition plate provided at a lateral side of the first body or the second body to partition a respective one of the first or second coils around first the body or the second body; and
   a connection hole provided in the partition plate, portions of the one of the first or second coils connecting through the connection hole.

3. A power supply apparatus comprising:
   a filter unit having a line filter to filter an input AC signal;
   a rectifying unit to rectify the filtered signal into a DC signal; and
   a transforming unit to convert the DC signal to have a predetermined size,
   wherein the line filter comprises:
      a first bobbin having a first through hole formed through upper and lower surface of a first body in an axial direction;
      a second bobbin having a second through hole formed through upper and lower surface of a second body in the axial direction, and separated from the first bobbin;
      a first inductor having a first coil wound around the first body of the first bobbin;
      a second inductor having a second coil wound around the second body of the second bobbin, the second inductor being induced by the first inductor to flow current;
      first magnetic cores inserted into first sides of the first and second through holes of the first and second bobbins;
      second magnetic cores inserted into second sides of the first and second through holes of the first and second bobbins, the second sides being opposite to the first sides;
      coupling members provided at both first and second sides of the first and second bobbins; and
      a cover part to cover upper surfaces and lateral sides of the first and second bobbins and the first and second magnetic cores,
   wherein the first inductor is connected to ground via a first path that includes a first capacitor and excludes a second capacitor, and the second inductor is connected to ground via a second path that includes the second capacitor and excludes the first capacitor,
   wherein the first bobbin is parallel to the second bobbin,
   wherein the cover part includes:
      a first cover part coupled to the first magnetic cores and including a first fastening part to fix the first cover part to a printed circuit board; and
      a second cover part coupled to the second magnetic cores and physically separated from the first cover part, and including a second fastening part to fix the second cover part to the printed circuit board,
wherein the coupling members include:
  a third through hole corresponding to the first through hole of the first body and the second through hole of the second body;
  a first protrusion protruding in the axial direction of the first and second bobbins to support the cover part; and
  a second protrusion provided at lower surfaces of the coupling members and coupled with the printed circuit board,
wherein the first protrusion is protruded in a direction perpendicular to a plane where the third through hole is formed,
wherein the second protrusion is protruded toward a plane where the coupling member makes contact with the printed circuit board, and
wherein surfaces of the first bobbin and the second bobbin are formed through a polishing scheme.

* * * * *